United States Patent
Yokoyama et al.

(10) Patent No.: US 8,531,087 B2
(45) Date of Patent: Sep. 10, 2013

(54) PIEZOELECTRIC THIN-FILM RESONATOR WITH DISTRIBUTED CONCAVE OR CONVEX PATTERNS

(75) Inventors: Tsuyoshi Yokoyama, Tokyo (JP); Shinji Taniguchi, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/570,422

(22) Filed: Aug. 9, 2012

(65) Prior Publication Data

US 2012/0299444 A1 Nov. 29, 2012

Related U.S. Application Data

(63) Continuation of application No. PCT/JP2011/050244, filed on Jan. 11, 2011.

(30) Foreign Application Priority Data

Feb. 10, 2010 (JP) ................................. 2010-027613

(51) Int. Cl.
*H01L 41/08* (2006.01)
*H03H 9/13* (2006.01)

(52) U.S. Cl.
CPC ...................................... *H03H 9/13* (2013.01)
USPC .......................................... 310/329; 310/330

(58) Field of Classification Search
USPC .................. 310/320–322, 329–330; 333/187, 333/189, 195
See application file for complete search history.

(56) References Cited

U.S. PATENT DOCUMENTS

| 6,657,363 | B1 | 12/2003 | Aigner |
| 7,675,389 | B2* | 3/2010 | Yamakawa et al. ............ 333/133 |
| 8,344,590 | B2* | 1/2013 | Yokoyama et al. ............ 310/321 |
| 2008/0169885 | A1 | 7/2008 | Ueda et al. |
| 2008/0290969 | A1 | 11/2008 | Yamakawa et al. |
| 2011/0241800 | A1* | 10/2011 | Yokoyama et al. ............ 333/188 |
| 2012/0182092 | A1* | 7/2012 | Yokoyama et al. ............ 333/195 |
| 2012/0299444 | A1* | 11/2012 | Yokoyama et al. ............ 310/326 |
| 2013/0033337 | A1* | 2/2013 | Nishihara et al. ............ 333/133 |

FOREIGN PATENT DOCUMENTS

| JP | 2002-515667 A | 5/2002 |
| JP | 2007-184816 A | 7/2007 |
| JP | 2008-172494 A | 7/2008 |

(Continued)

OTHER PUBLICATIONS

Written Opinion (PCT/ISA/237) issued in PCT/JP2011/050244 mailed in Mar. 2011.

(Continued)

*Primary Examiner* — J. San Martin
(74) *Attorney, Agent, or Firm* — Chen Yoshimura LLP

(57) ABSTRACT

A piezoelectric thin-film resonator includes a substrate, a lower electrode provided on the substrate, a piezoelectric film provided on the lower electrode and an upper electrode that is located opposite the lower electrode across at least a part of the piezoelectric film. A mass load film is provided on the upper electrode. The mass load film includes a plurality of concave or convex patterns in at least a region that faces the lower electrode. The plurality of concave or convex patterns are densely arranged in a central portion of the region and are sparsely arranged in a peripheral portion of the region.

4 Claims, 14 Drawing Sheets

(56) References Cited

FOREIGN PATENT DOCUMENTS

| | | |
|---|---|---|
| JP | 2008-244853 A | 10/2008 |
| WO | 2007/000929 A1 | 1/2007 |
| WO | 2010/061479 A1 | 6/2010 |

OTHER PUBLICATIONS

International Search Report (ISR) issued in PCT/JP2011/050244 mailed in Mar. 2011.

* cited by examiner

PIEZOELECTRIC THIN-FILM RESONATOR WITH DISTRIBUTED CONCAVE OR CONVEX PATTERNS

CROSS-REFERENCE TO RELATED APPLICATION

This application is a continuation of International Application No. PCT/JP2011/050244, filed on Jan. 11, 2011 and is based upon and claims the benefit of priority of the prior Japanese Patent Application No. 2010-027613, filed on Feb. 10, 2010, the entire contents of which are incorporated herein by reference.

FIELD

The disclosure of the present application relates to a piezoelectric thin-film resonator, a communication module, and a communication device.

BACKGROUND

In recent years, with the rapid spread of radio equipment as typified by a mobile phone, a filter device for high frequency communication has been developed, which transmits only electric signals in a specific frequency band and is obtained by combining two or more resonators that are made of piezoelectric materials and use surface acoustic waves (SAW) or bulk acoustic waves (BAW). So far, a dielectric filter and a SAW filter have been mainly used. However, a filter composed of a piezoelectric thin-film resonator has recently attracted much attention because the piezoelectric thin-film resonator exhibits good performance particularly at high frequencies, and also can be formed as a small monolithic device.

In the piezoelectric thin-film resonator, the vibration that propagates in a direction perpendicular to an electrode surface is defined as a fundamental mode of vibration. In some cases, there may be another mode of vibration that propagates in a direction parallel to the electrode surface. Such a vibration that propagates in the direction parallel to the electrode surface is called "transverse mode spurious", which is noise for the fundamental mode of vibration.

Patent Document 1 discloses a piezoelectric thin-film resonator in which a plurality of holes are provided in a portion of an upper electrode that is located opposite a lower electrode across at least a part of a piezoelectric thin film. The plurality of holes are irregularly arranged and have irregular sizes or shapes, so that the transverse mode spurious can be suppressed.

Patent Document 1: JP 2007-184816 A

However, the inventors found that in the piezoelectric thin-film resonator disclosed in Patent Document 1, it is difficult to provide an arrangement method of the holes or a pattern design to suppress the transverse mode spurious.

SUMMARY

An example of a piezoelectric thin-film resonator disclosed in the present application includes a substrate, a lower electrode provided on the substrate, a piezoelectric film provided on the lower electrode, and an upper electrode that is located opposite the lower electrode across at least a part of the piezoelectric film. The upper electrode includes a plurality of concave or convex patterns in at least a region that faces the lower electrode. The plurality of concave or convex patterns are densely arranged in a central portion of the region and are sparsely arranged in a peripheral portion of the region.

Another example of a piezoelectric thin-film resonator disclosed in the present application includes a substrate, a lower electrode provided on the substrate, a piezoelectric film provided on the lower electrode, and an upper electrode that is located opposite the lower electrode across at least a part of the piezoelectric film. A mass load film is provided on the upper electrode. The mass load film includes a plurality of concave or convex patterns in at least a region that faces the lower electrode. The plurality of concave or convex patterns are densely arranged in a central portion of the region and are sparsely arranged in a peripheral portion of the region.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

EMBODIMENTS

[1. Configuration of Piezoelectric Thin-Film Resonator]

Figure 1A:
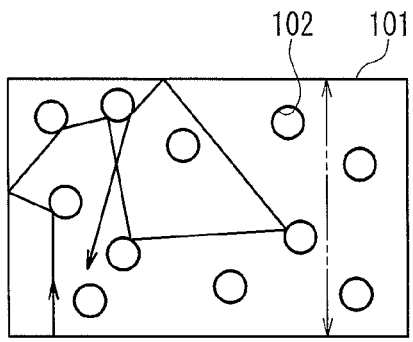
FIG. 1A is a plan view of an example of an upper electrode having holes at irregular positions.

There are two types of piezoelectric thin-film resonators: FBAR (film bulk acoustic resonator) and SMR (solidly mounted resonator).

The former has a structure of upper electrode/piezoelectric film/lower electrode on a substrate as the main components. A cavity is formed under the lower electrode and located in a region where the upper electrode and the lower electrode face each other. In this case, the cavity may be formed by wet etching a sacrificial layer that is formed between the surface of the substrate and the lower electrode. Alternately, the cavity may be formed by wet etching or dry etching the substrate from the back side. The latter has a structure in which films with a high acoustic impedance and a thickness of $\lambda/4$ ($\lambda$: the wavelength of an acoustic wave) and films with a low acoustic impedance and a thickness of $\lambda/4$ are alternately laminated, and the laminated film is used as an acoustic reflection film and as a substitute for the cavity.

The electrode films of the piezoelectric thin-film resonator may be made of, e.g., aluminum (Al), copper (Cu), chromium (Cr), molybdenum (Mo), tungsten (W), tantalum (Ta), platinum (Pt), ruthenium (Ru), rhodium (Rh), or iridium (Ir). The piezoelectric film may be made of, e.g., aluminum nitride (AlN), zinc oxide (ZnO), lead zirconate titanate (PZT), or lead titanate (PbTiO$_3$). The substrate may be made of, e.g., silicon (Si), glass, or ceramics.

When a high frequency voltage is applied as an electric signal between the upper electrode and the lower electrode of the piezoelectric thin-film resonator, an acoustic wave is excited in the piezoelectric film sandwiched between the upper electrode and the lower electrode due to the inverse piezoelectric effect. Moreover, a distortion caused by the acoustic wave is converted into an electric signal by the piezoelectric effect. Such an acoustic wave is totally reflected from the surface of the upper electrode film that is in contact with the air and the surface of the lower electrode film that is in contact with the air. Therefore, the acoustic wave is a longitudinal oscillatory wave in which the main displacement is in the thickness direction of the piezoelectric film. The use of this resonance phenomenon can provide a resonator having desired frequency characteristics (or a filter formed by connecting a plurality of the resonators).

For example, in the case of the FBAR-type piezoelectric thin-film resonator, resonance occurs at a frequency when the equation $H=n\lambda/2$ holds, where H represents a total thickness of the laminated structure including the upper electrode film, the piezoelectric film, and the lower electrode film that are formed on the cavity as the main components, $\lambda$ represents a wavelength of the acoustic wave, and n is an integer. That is, the resonance occurs at a frequency when the total thickness H is an integral multiple (n times) of one-half wavelength $\lambda$, ($\frac{1}{2}$ wavelength) of the acoustic wave. The resonance frequency F can be determined by $$F=nV/2H$$

where V represents a propagation velocity of the acoustic wave that depends on the material of the piezoelectric film. Thus, the resonance frequency F can be controlled by the total thickness H of the laminated structure.

In the piezoelectric thin-film resonator, the vibration that propagates in a direction perpendicular to the electrode surface is defined as a fundamental mode of vibration. In some cases, there may be another mode of vibration that propagates in a direction parallel to the electrode surface. Such a vibration that propagates in the direction parallel to the electrode surface is called "transverse mode spurious", which is noise for the fundamental mode of vibration.

Figure 1B:
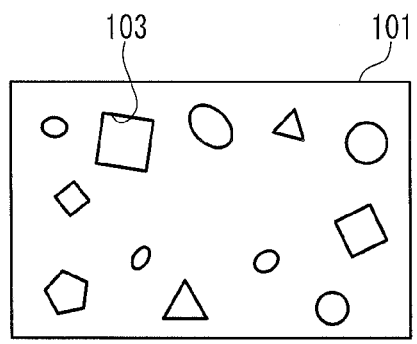
FIG. 1B is a plan view of an example of an upper electrode having holes with irregular shapes.
Figure 1C:
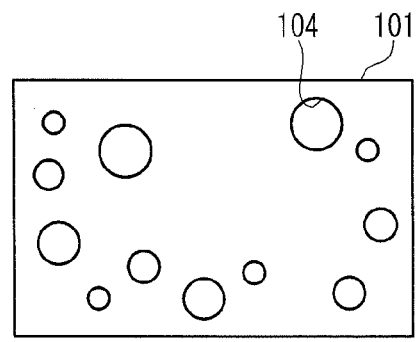
FIG. 1C is a plan view of an example of an upper electrode having holes with irregular sizes.

JP 2007-184816 A discloses the piezoelectric thin-film resonator in which a plurality of holes are provided in the portion of the upper electrode that is located opposite the lower electrode across at least a part of the piezoelectric thin film. This piezoelectric thin-film resonator suppresses the transverse mode spurious by adjusting the arrangement, size or shape of the holes. FIG. 1A is a schematic diagram of an upper electrode 101 having a plurality of holes 102 that are irregularly arranged. FIG. 1B is a schematic diagram of the upper electrode 101 having a plurality of holes 103 with irregular shapes. FIG. 1C is a schematic diagram of the upper electrode 101 having a plurality of holes 104 with irregular sizes.

However, in the piezoelectric thin-film resonator disclosed in JP 2007-184816 A, it is difficult to provide an arrangement method of the holes or a pattern design to suppress the transverse mode spurious.

Example 1

Figure 2A:
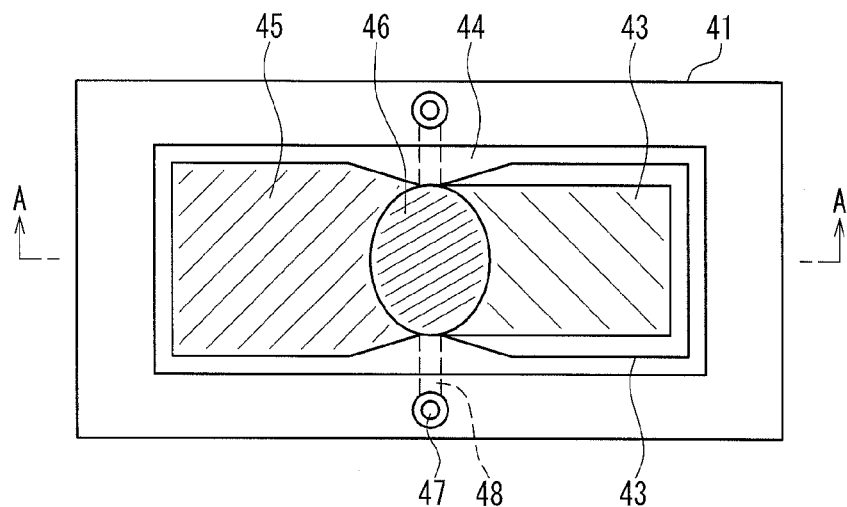
FIG. 2A is a plan view of an example of a piezoelectric thin-film resonator of an embodiment.
Figure 2B:
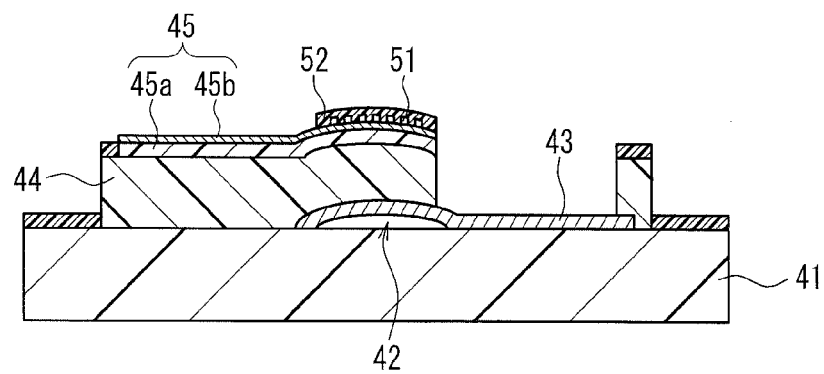
FIG. 2B is a cross-sectional view taken along the line A-A in FIG. 2A.

FIG. 2A is a plan view of a piezoelectric thin-film resonator (Example 1) of an embodiment. FIG. 2B is a cross-sectional view taken along the line A-A in FIG. 2A.

As shown in FIG. 2A, the piezoelectric thin-film resonator of Example 1 includes a substrate 41, a lower electrode 43, a piezoelectric film 44, an upper electrode 45, a mass load film 51, and a frequency adjustment film 52. The substrate 41 is made of, e.g., Si. The lower electrode 43 has, e.g., a two-layer structure of Ru/Cr. The piezoelectric film 44 is made of, e.g., AlN. The upper electrode 45 has, e.g., a two-layer structure of a first layer 45a (Ru) and a second layer 45b (Cr). The lower electrode 43, the piezoelectric film 44, and the upper electrode 45 can be formed on the substrate 41 by a film forming method such as sputtering.

For example, in the case of the piezoelectric thin-film resonator having a resonance frequency of 2 GHz, the thickness of each layer may be approximately determined as follows: the Ru film of the lower electrode 43 is 250 nm; the Cr film of the lower electrode 43 is 100 nm; the piezoelectric film 44 (AlN) is 1150 nm; the second layer 45b (Cr) of the upper electrode 45 is 20 nm; and the first layer 45a (Ru) of the upper electrode 45 is 250 nm. The mass load film 51 is made of, e.g., Ti with a thickness of 50 nm. The mass load film 51 is formed on the second layer 45b of the upper electrode 45 and located in at least a region where the upper electrode 45 and the lower electrode 43 face each other. The frequency adjustment film 52 is formed above the second layer 45b so as to cover the mass load film 51. The frequency adjustment film 52 is made of, e.g., SiO$_2$.

The thickness of each layer can be adjusted according to the requirements specification of the filter. Therefore, the lower electrode 43, the upper electrode 45, the piezoelectric film 44, the mass load film 51, and the frequency adjustment film 52 can have configurations other than the above. Although the lower electrode 43 and the upper electrode 45 have the two-layer structure in Example 1, they may have a single-layer structure. The mass load film 51 is formed on the second layer 45b of the upper electrode 45 in Example 1, but may be sandwiched between the first layer 45a and the second layer 45b. A dome-like cavity (raised portion) is formed between the lower electrode 43 and the substrate 41 and located in the region where the upper electrode 45 and the lower electrode 43 face each other. The "dome-like cavity"

has a shape that protrudes from the substrate 41 so that the height of the cavity is low at the periphery and increases toward the center.

Figure 3A:
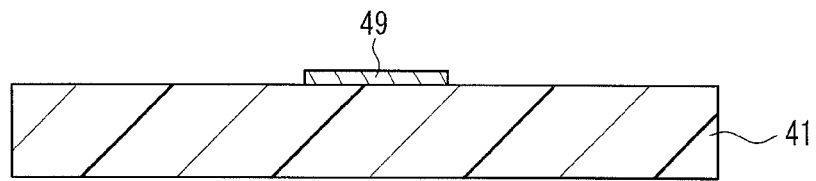
FIG. 3A is a cross-sectional view showing an example of a manufacturing process of a piezoelectric thin-film resonator.

FIGS. 3A to 3D are cross-sectional views showing manufacturing processes of the piezoelectric thin-film resonator of Example 1. First, as shown in FIG. 3A, a sacrificial layer 49 including, e.g., a magnesium oxide (MgO) is formed on the Si substrate 41, e.g., by sputtering or vapor deposition. The substrate 41 may be a quartz substrate, a glass substrate, a ceramics substrate, or a GaAs substrate other than the Si substrate. In particular, the substrate that is not easily etched is preferred so as to prevent the substrate 41 from being etched with an etchant used for etching the sacrificial layer 49 in a cavity forming process, as will be described later. Moreover, it is preferable that the sacrificial layer 49 is made of a material such as ZnO, Ge, Ti, or Cu that can be easily dissolved in the etchant or etching gas. After the formation of the sacrificial layer 49, it is processed into a desired shape using the exposure technique and the etching technique.

Figure 3B:
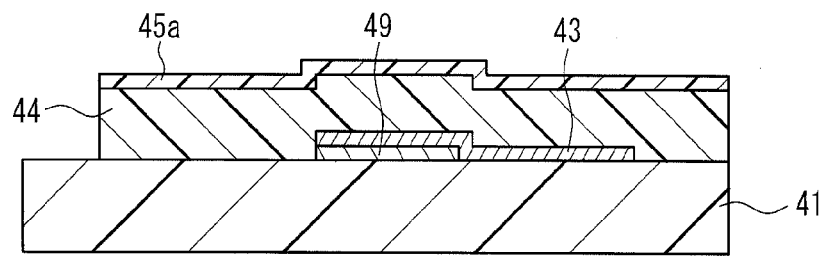
FIG. 3B is a cross-sectional view showing an example of a manufacturing process of a piezoelectric thin-film resonator.

Next, as shown in FIG. 3B, the lower electrode 43 is formed on the substrate 41 and the sacrificial layer 49. In this case, Ru/Cr can be deposited by sputtering or the like to form the lower electrode 43. Then, the lower electrode 43 is patterned into a desired shape to cover the sacrificial layer 49 using the exposure technique and the etching technique. At this time, it is preferable that a guide path 48 and guide holes 47 (see FIG. 2A) are formed in the lower electrode 43 in order to introduce an etching medium for the sacrificial layer 49. Next, the piezoelectric film 44 (AlN) is formed on the substrate 41 and the lower electrode 43 by sputtering or the like. Subsequently, the first layer 45a (Ru) of the upper electrode 45 is formed on the piezoelectric film 44, and the second layer 45b (Cr) is formed on the first layer 45a.

Figure 3C:
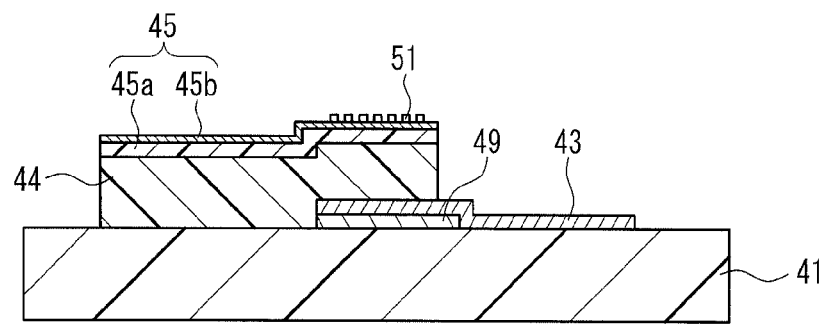
FIG. 3C is a cross-sectional view showing an example of a manufacturing process of a piezoelectric thin-film resonator.
Figure 4:
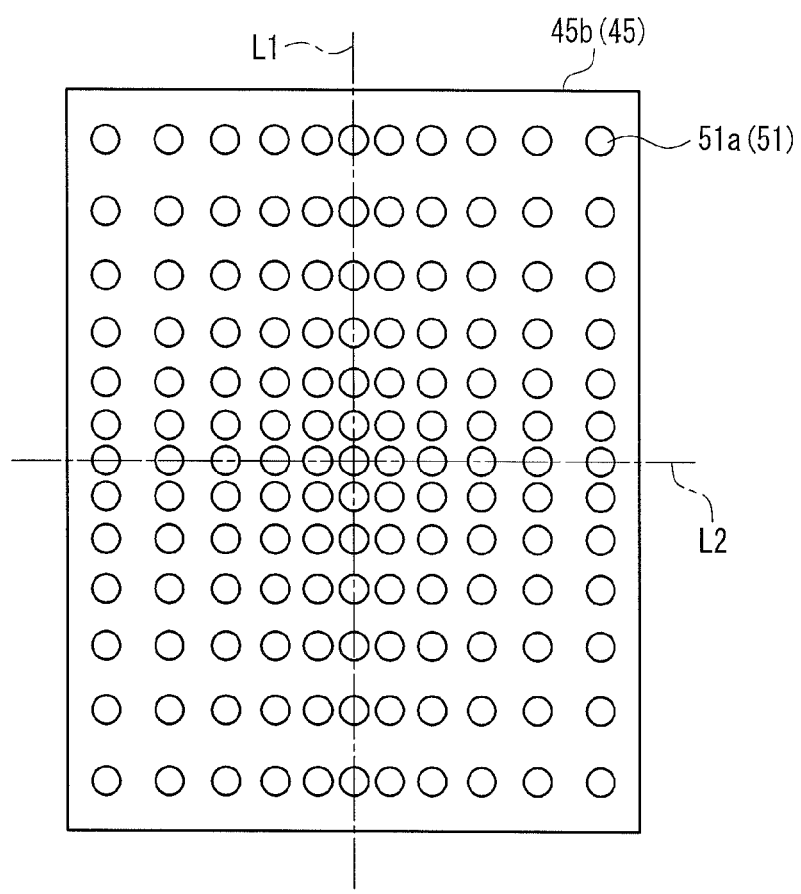
FIG. 4 is a plan view of a mass load film of Example 1.

Next, as shown in FIG. 3C, the mass load film 51 (Ti) is formed on the second layer 45b by sputtering or the like. Then, the mass load film 51 located in at least the region where the upper electrode 45 and the lower electrode 43 face each other is patterned into a desired shape using the exposure technique and the etching technique. In this case, as shown in FIG. 4, the mass load film 51 is formed as a plurality of patterns having an island structure (referred to as island patterns 51a in the following) on the upper electrode 45, and the island patterns 51a are located in at least the region where the upper electrode 45 and the lower electrode 43 face each other. The configuration of the island patterns 51a will be described later.

Next, the upper electrode 45 is patterned into a desired shape using the exposure technique and the etching technique. Then, the piezoelectric film 44 is patterned into a desired shape using the exposure technique and the etching technique.

Figure 3D:
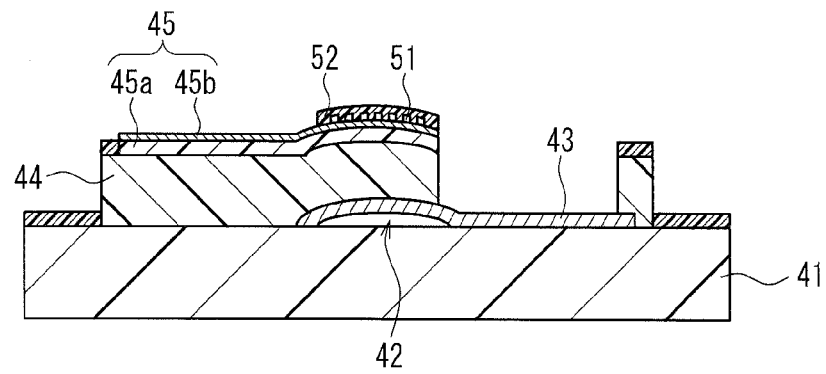
FIG. 3D is a cross-sectional view showing an example of a manufacturing process of a piezoelectric thin-film resonator.

Next, as shown in FIG. 3D, the frequency adjustment film 52 ($SiO_2$) is formed by sputtering or the like. The frequency adjustment film 52 is not limited to $SiO_2$, and may use other insulating films such as a metal oxide film and a metal nitride film, with which a part of excitation energy can be gradually reduced. Subsequently, the frequency adjustment film 52 located on the upper electrode 45 is removed by the exposure technique and the etching technique, and a bump pad (not shown) is formed on that portion of the upper electrode 45 after removal of the frequency adjustment film 52. Finally, the frequency adjustment film 52 located on the guide holes 47 (see FIG. 2A) that are formed in the lower electrode 43 is removed by the exposure technique and the etching technique, and then the etching medium for the sacrificial layer 49 is introduced from the guide holes 47 through the guide path 48 to the area under the lower electrode 43, so that the sacrificial layer 49 is removed. Thus, a cavity 42 defined by the dome-like raised portion is formed under the region where the upper electrode 45 and the lower electrode 43 face each other. The etchant used for etching the sacrificial layer 49 preferably has a composition such that the materials constituting the piezoelectric thin film resonator other than the sacrificial layer 49, particularly the electrode materials on the sacrificial layer 49, which are to come into contact with the etchant, are not etched.

To obtain the effect of this example, the materials for each of the substrate, the electrode films, and the piezoelectric film are not limited to the above materials, and other materials also may be used. Moreover, an acoustic reflection film may be formed by alternately laminating films with a high acoustic impedance and a thickness of $\lambda/4$ ($\lambda$: the wavelength of an acoustic wave) and films with a low acoustic impedance and a thickness of $\lambda/4$ as a substitute for the physical cavity as described above.

FIG. 4 is a plan view showing a central portion in the vicinity of an opposing region of the upper electrode 45. As shown in FIG. 4, the island patterns 51a are densely arranged (high density) in the central portion (containing a point of intersection of two lines L1 and L2) of the opposing region, and the island patterns 51a are sparsely arranged (low density) in the peripheral portion of the opposing region. In this example, the pitch of the island patterns 51a between the central portion and the peripheral portion is varied at a constant rate so that the island patterns 51a are densely arranged in the central portion and sparsely arranged in the peripheral portion of the opposing region. In the context of the present invention, the "island pattern" or the "island structure" indicates that the mass load film 51 is formed as a plurality of dot patterns on a resonator as an example. The mass load film 51 (Ti) can be etched by either dry etching or wet etching. However, the dry etching is preferred because it can easily achieve a fine pattern shape, and also can reduce under-etching. The height of the pattern of the mass load film 51 may be lower than the thickness of the mass load film 51 before patterning. By making the height of the pattern of the mass load film 51 comparable to the thickness, etching variations can be reduced during the pattern formation. Moreover, when a combination of the material of the mass load film 51 and the material of the upper electrode 45 is selected so as to have etching selectivity, damage to the other films can be reduced, and thus an acoustic wave device having excellent characteristics can be stably provided.

Figure 5:
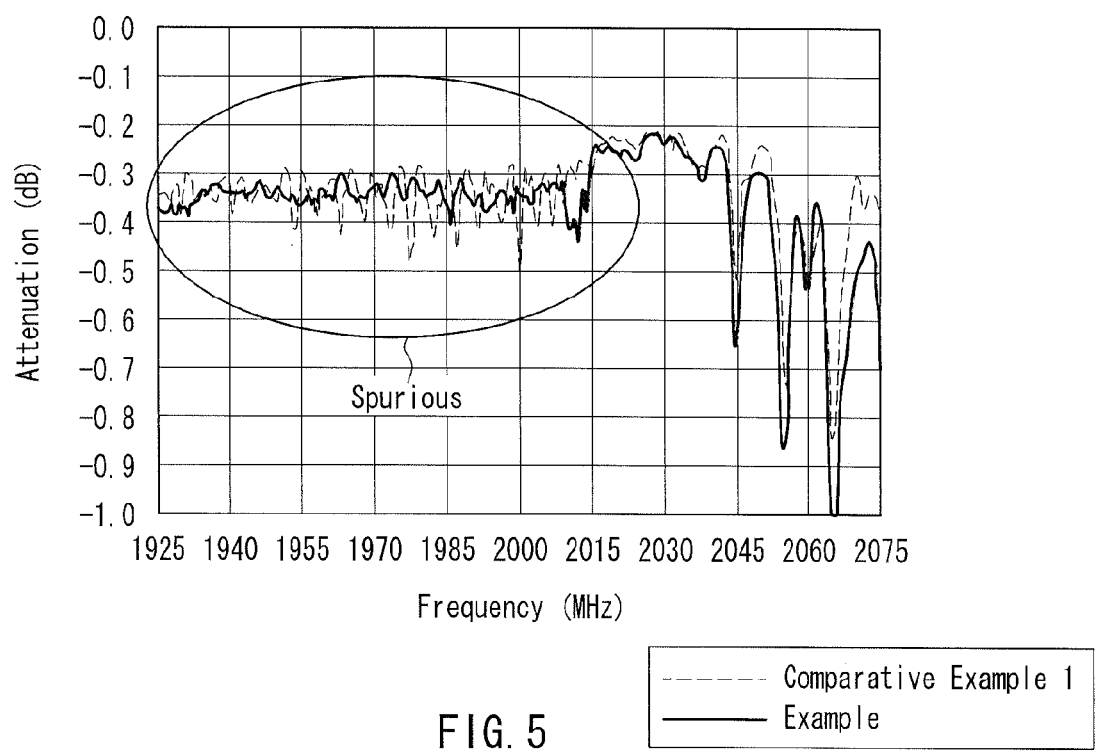
FIG. 5 is a characteristic diagram showing an example of the resonance characteristics of a piezoelectric thin-film resonator.

FIG. 5 shows the resonance characteristics of the piezoelectric thin-film resonator of Example 1. In FIG. 5, the solid line represents the resonance characteristics of the piezoelectric thin-film resonator of Example 1, and the broken line represents the resonance characteristics of a piezoelectric thin-film resonator that does not include a mass load film. The resonance frequency is equal to or around 2015 MHz. The resonance characteristics shown in FIG. 5 are obtained using the piezoelectric thin-film resonator in which the island patterns 51a of the mass load film 51 are densely arranged in the central portion of the region where the upper electrode 45 and the lower electrode 43 face each other (i.e., the opposing region), and the island patterns 51a are sparsely arranged in the peripheral portion of the opposing region, as shown in FIG. 4. In this case, the planar shape of an island pattern 51a is, e.g., circular with a diameter of 2 μm. The island patterns 51a are arranged in the following manner. For example, one island pattern 51a is placed in the center (i.e., the point of intersection of two lines L1 and L2 in FIG. 4) of the opposing region (referred to as a "center pattern" in the following). Then, the island patterns 51a are arranged to be adjacent to the center pattern in both vertical and horizontal directions with a pitch of 7 μm (referred to as "first adjacent patterns" in the following). Moreover, the island patterns 51*a* are arranged to be adjacent to the first adjacent patterns in both vertical and horizontal directions, e.g., with a pitch of 8 μm, which is increased by a predetermined amount (1 μm) from the pitch (7 μm) between the center pattern and any of the first adjacent patterns (referred to as "second adjacent patterns" in the following). Further, the island patterns 51*a* are arranged to be adjacent to the second adjacent patterns in both vertical and horizontal directions with a pitch of 9 μm. In other words, the pitch of the island patterns 51*a* is increased in predetermined increments from the initial pitch (i.e., the pitch between the center pattern and any of the first adjacent patterns) from the central portion to the peripheral portion of the opposing region.

The above arrangement of the island patterns 51*a* can provide the mass load film 51 that is capable of reducing unwanted spurious in a simple manner with excellent design performance, compared to the irregular arrangement of patterns as disclosed in JP 2007-184816 A. Arranging the island patterns 51*a* of the mass load film 51 densely in the central portion and sparsely in the peripheral portion of the opposing region is equal to the fact that the pseudo-density of the film is made high in the central portion and low in the peripheral portion. Thus, this arrangement can reduce the confinement effect of a transverse acoustic wave that is other than the thickness longitudinal vibration (principal vibration) and causes unwanted spurious, which results in a reduction in unwanted spurious.

FIG. 5 also shows the resonance characteristics of the piezoelectric thin-film resonator that does not include a mass load film (Comparative Example 1) for comparison with the resonance characteristics in Example 1. FIG. 5 shows the bandpass characteristics of the piezoelectric thin-film resonator in the vicinity of the resonance frequency, and the loss is minimized at about the resonance frequency (2015 MHz) and increased as the frequency is shifted away from the resonance frequency. Comparing the resonance characteristics of the two piezoelectric thin-film resonators, the piezoelectric thin-film resonator of the comparative example generates the transverse mode spurious at frequencies lower than the resonance frequency, while the piezoelectric thin-film resonator of this example can reduce the transverse mode spurious that occurs at frequencies lower than the resonance frequency. When a filter device is composed of the piezoelectric thin-film resonator of the comparative example, due to the spurious generated at frequencies lower than the resonance frequency, the loss is increased as ripple in a band, and thus the filter characteristics can be degraded.

Figure 6:
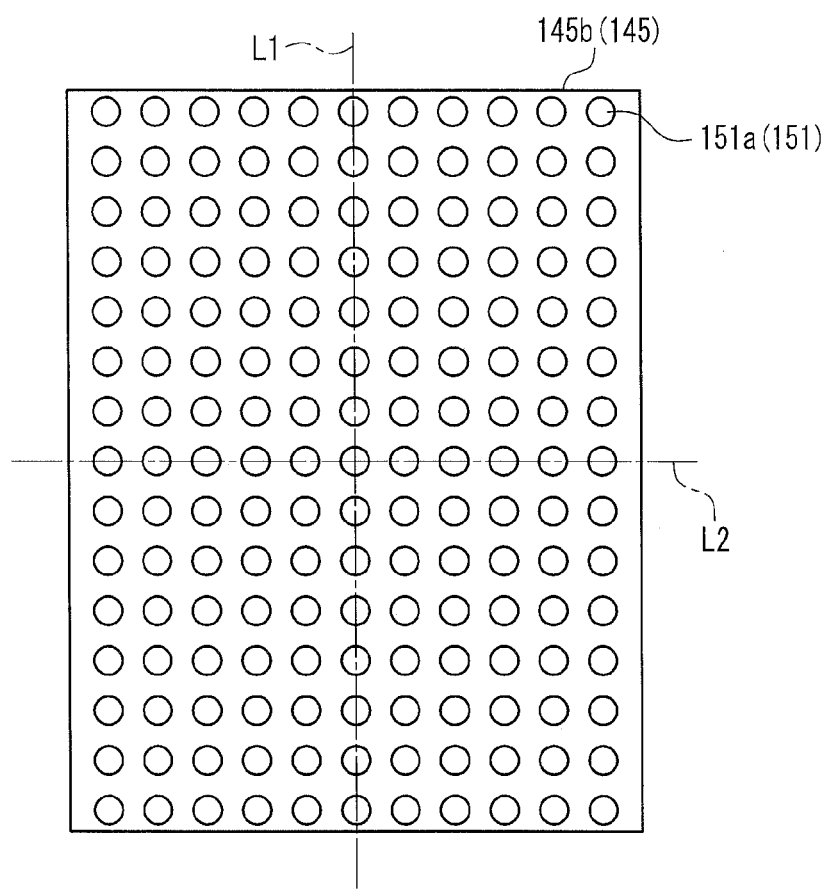
FIG. 6 is a plan view of a mass load film of Comparative Example 2.
Figure 7:
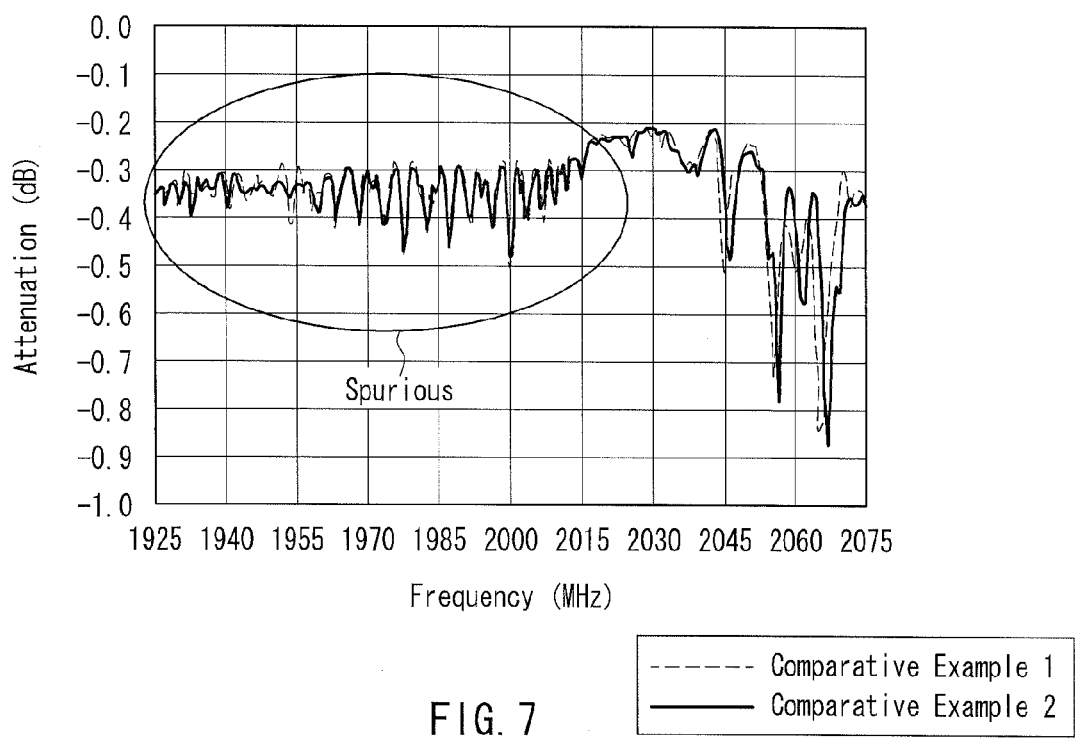
FIG. 7 is a characteristic diagram showing an example of the resonance characteristics of a piezoelectric thin-film resonator.

FIG. 6 is a plan view of a mass load film 151 in which island patterns 151*a* are periodically arranged (Comparative Example 2). FIG. 7 shows the resonance characteristics of a piezoelectric thin-film resonator that includes the mass load film 151 in FIG. 6, and the resonance characteristics of the piezoelectric thin-film resonator that does not include a mass load film. As shown in FIG. 6, the piezoelectric thin-film resonator of Comparative Example 2 includes the mass load film 151 including a plurality of island patterns 151*a* that are uniformly and periodically arranged on the upper electrode 145. As shown in FIG. 7, the level of spurious in the piezoelectric thin-film resonator of Comparative Example 2 is not significantly changed from that in the piezoelectric thin-film resonator that does not include a mass load film (Comparative Example 1).

Figure 8:
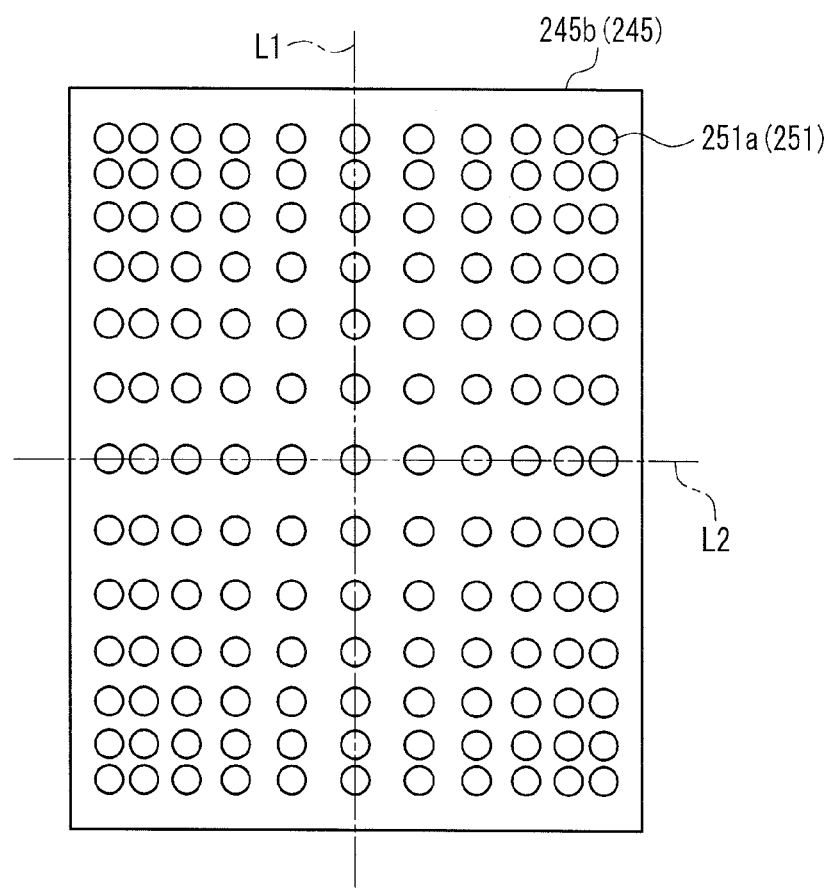
FIG. 8 is a plan view of a mass load film of Comparative Example 3.
Figure 9:
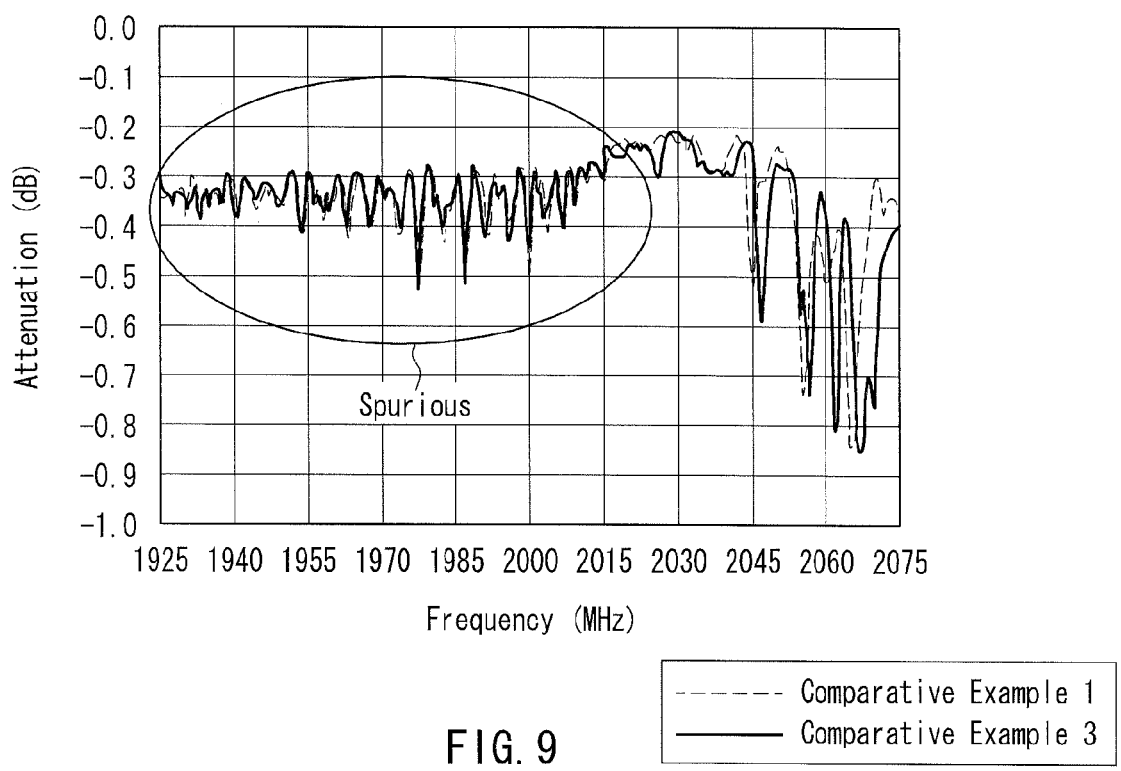
FIG. 9 is a characteristic diagram showing an example of the resonance characteristics of a piezoelectric thin-film resonator.

FIG. 8 is a plan view of a mass load film 251 in which island patterns 251*a* are sparsely arranged in the central portion (containing a point of intersection of two lines L1 and L2) of the opposing region, and the island patterns 251*a* are densely arranged in the peripheral portion of the opposing region (Comparative Example 3). FIG. 9 shows the resonance characteristics of a piezoelectric thin-film resonator that includes the mass load film 251 in FIG. 8 (Comparative Example 3), and the resonance characteristics of the piezoelectric thin-film resonator that does not include a mass load film (Comparative Example 1). As shown in FIG. 8, the piezoelectric thin-film resonator of Comparative Example 3 includes the mass load film 251 including a plurality of island patterns 251*a* that are sparsely arranged in the central portion and densely arranged in the peripheral portion of the opposing region. As shown in FIG. 9, the level of spurious in the piezoelectric thin-film resonator of Comparative Example 3 is not changed from that in the piezoelectric thin-film resonator that does not include a mass load film (Comparative Example 1).

Figure 10:
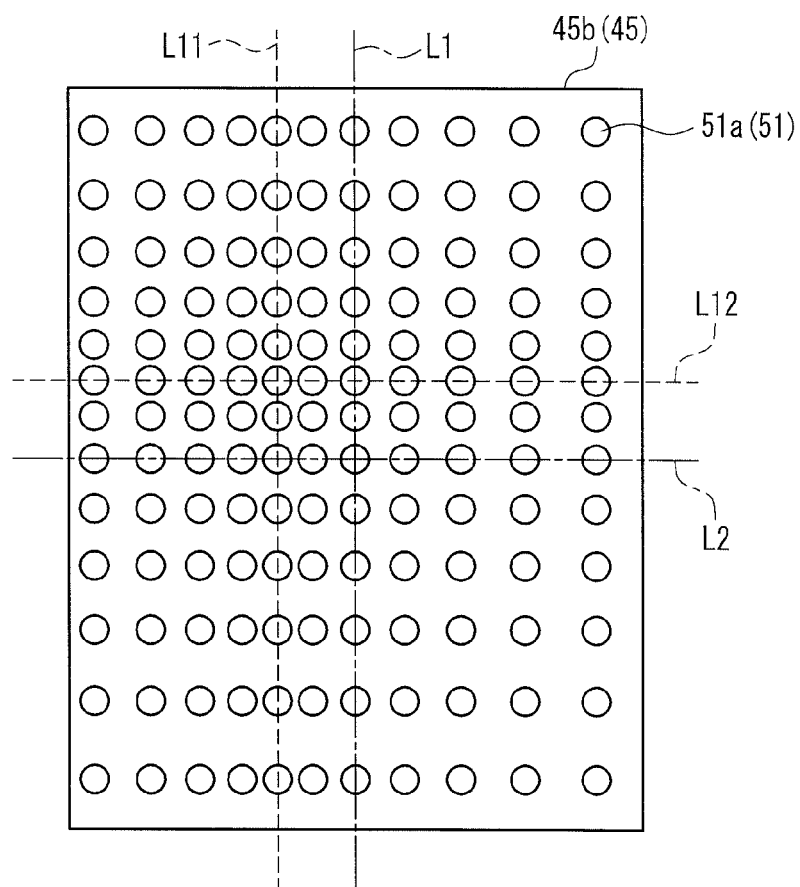
FIG. 10 is a plan view showing a modified example of a mass load film.

The plurality of patterns of the mass load film 51 are not limited to the island patterns, and may be hole patterns. Moreover, in addition to the above method for arranging the plurality of patterns, as shown in FIG. 10, the center position (i.e., a point of intersection of two lines L11 and L12) of the arrangement of the patterns may be displaced from the center (i.e., the point of intersection of two lines L1 and L2) of the region where the upper electrode and the lower electrode face each other. In this example, the pitch of the plurality of patterns of the mass load film is increased at a constant rate so that the patterns are densely arranged in the central portion and sparsely arranged in the peripheral portion of the opposing region. However, the pattern structure may be formed by a method with different regularity.

To obtain the effect of this embodiment, the materials for each of the substrate 41, the upper electrode 45, the lower electrode 43, the piezoelectric film 44, and the mass load film 51 are not limited to the above materials, and other materials also may be used. The above film configuration includes only the main components of the piezoelectric thin-film resonator. For example, a dielectric film may be provided under the lower electrode 43 or on the upper electrode 45. The dielectric film provided under the lower electrode 43 serves, e.g., as a reinforcing material or an etching stop layer. The dielectric film provided on the upper electrode 45 serves, e.g., as a passivation film or a frequency regulator.

The dome-like cavity 42 protrudes from the substrate 41 toward the composite film. Therefore, the substrate 41 does not need to be etched, and the productivity can be improved. Moreover, since the substrate 41 is not etched, it is also possible to prevent the degradation of mechanical strength of the substrate 41. Further, integration can be achieved because only a small area is required to form the cavity 42.

In this embodiment, the region where the upper electrode 45 and the lower electrode 43 face each other (i.e., the opposing region) is in the form of an ellipse, as shown in FIG. 2A. However, the opposing region may be in the form of a polygon in which the opposing sides are not parallel to each other. When the opposing region is in the form of a polygon with non-parallel sides, the acoustic wave reflected from the side edge of the electrode is not likely to be a transverse standing wave in a resonance portion due to the absence of parallel sides. Thus, the occurrence of ripple in a pass band can be suppressed.

In this example, the cavity 42 is formed on the flat principal surface of the substrate 41. However, a similar effect to that of this example also can be obtained with a piezoelectric thin-film resonator having the cavity 42 in the substrate 41 under the lower electrode 43. The cavity 42 under the lower electrode 43 can be formed by dry etching the substrate 41 after the upper electrode 45, the piezoelectric film 44, and the lower electrode 43 have been formed.

Example 2

Figure 11:
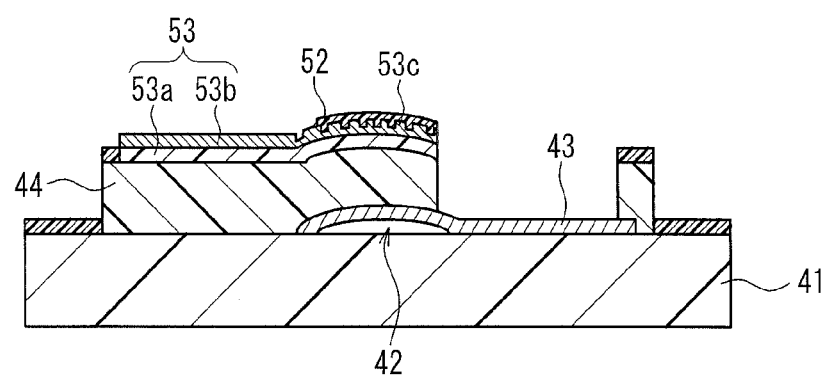
FIG. 11 is a cross-sectional view of a piezoelectric thin-film resonator of Example 2.

FIG. 11 is a cross-sectional view of a piezoelectric thin-film resonator (Example 2) of this embodiment. In the piezoelectric thin-film resonator shown in FIG. 11, the same components as those of the piezoelectric thin-film resonator of Example 1 are denoted by the same reference numerals, and the detailed explanation will not be repeated. In FIG. 11, the piezoelectric thin-film resonator includes an upper electrode 53 having a mass load portion 53c as a substitute for the upper electrode 45 in Example 1.

The substrate 41 is made of Si. The lower electrode 43 has a two-layer structure of Ru/Cr. The piezoelectric film 44 is made of AlN. The upper electrode 53 has a two-layer structure of a first layer 53a (Ru) and a second layer 53b (Cr). The lower electrode 43, the piezoelectric film 44, and the upper electrode 53 can be formed by a film forming method such as sputtering. For example, in the case of the piezoelectric thin-film resonator having a resonance frequency of 2 GHz, the thickness of each layer may be approximately determined as follows: the Ru film of the lower electrode 43 is 250 nm; the Cr film of the lower electrode 43 is 100 nm; the piezoelectric film 44 (AlN) is 1150 nm; the first layer 53a (Ru) of the upper electrode 53 is 250 nm; and the second layer 53b (Cr) of the upper electrode 53 is 20 nm. Moreover, the frequency adjustment film 52 including $SiO_2$ is provided as an uppermost layer in the opposing region. The thickness of each layer can be adjusted according to the requirements specification of the filter. Therefore, the electrode films, the piezoelectric film, and the frequency adjustment film can have configurations other than the above. Although the lower electrode 43 and the upper electrode 53 have the two-layer structure in this example, they may have a single-layer structure.

In this example, a portion of the upper electrode 53 is used to provide the mass load portion 53c that includes a plurality of concave or convex patterns so that the concave or convex patterns are densely arranged in the central portion of the region where the upper electrode and the lower electrode face each other (i.e., the opposing region), and the concave or convex patterns are sparsely arranged in the peripheral portion of the opposing region, as shown in FIG. 4. As shown in FIG. 11, when the mass load portion 53c including the plurality of concave or convex patterns is formed in a portion of the upper electrode 53, spurious can be reduced at a low cost without using an additional film.

Example 3

Figure 12:
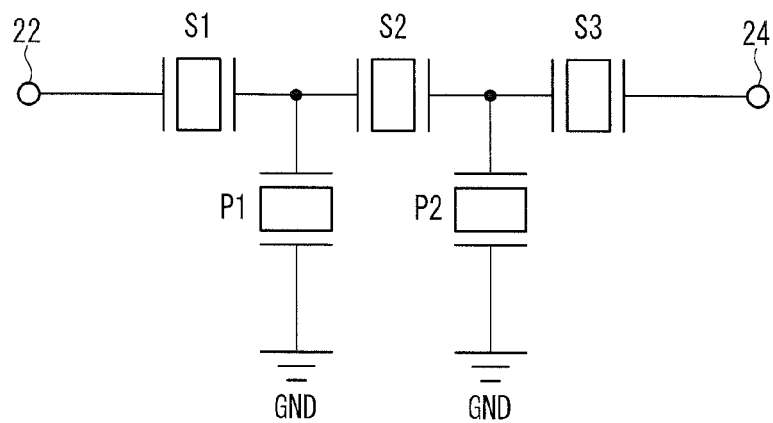
FIG. 12 is a circuit diagram of a ladder filter of Example 3.

FIG. 12 is a circuit diagram of a ladder filter. In the ladder filter shown in FIG. 12, series resonators S1 to S3 are connected between an input terminal 22 and an output terminal 24 (i.e., series arms). A parallel resonator P1 is connected between the node between the series resonators S1, S2 and the ground. A parallel resonator P2 is connected between the node between the series resonators S2, S3 and the ground. The series resonators S1 to S3 and the parallel resonators P1, P2 can be achieved with the use of the piezoelectric thin-film resonators. In this case, at least one of the series resonators S1 to S3 and the parallel resonators P1, P2 can be the piezoelectric thin-film resonator of Example 1.

The resonance frequency of each of the resonators can be controlled by providing the mass load film 51 of Example 1 or the mass load portion 53c of Example 2 with the island structure or the hole structure, controlling the area of the mass load film in each of the resonators, and arranging the patterns of the resonators with the same pitches. Moreover, the positions (frequencies) at which spurious occurs in each of the resonators can be scattered. Accordingly, an acoustic wave device including a plurality of piezoelectric thin-film resonators can reduce spurious and have excellent characteristics.

Figure 13:
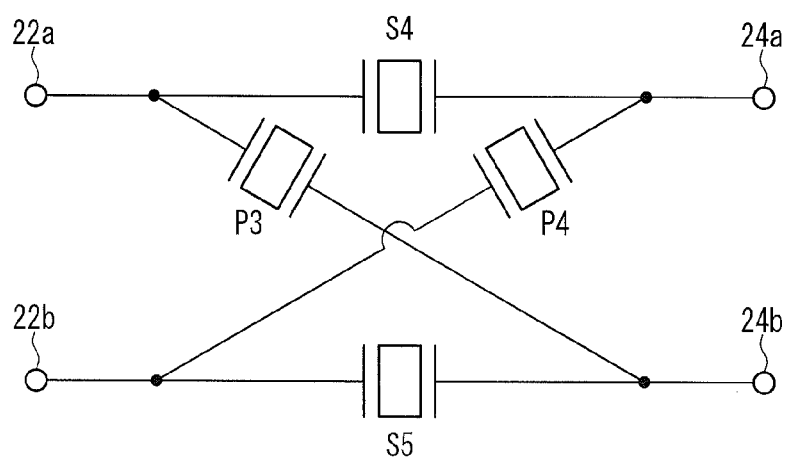
FIG. 13 is a circuit diagram of a lattice filter of Example 3.

In Example 3, the piezoelectric thin-film resonators of Example 1 and Example 2 are used for the ladder filter. However, they may be used for other acoustic wave devices such as a lattice filter. In the lattice filter, as shown in FIG. 13, a series resonator S4 is connected between an input terminal 22a and an output terminal 24a, and a series resonator S5 is connected between an input terminal 22b and an output terminal 24b. A parallel resonator P3 is connected between the input terminal 22a and the output terminal 24b. A parallel resonator P4 is connected between the input terminal 22b and the output terminal 24a. In this case, at least one of the series resonators S4, S5 and the parallel resonators P3, P4 can be the piezoelectric thin-film resonator of Example 1 or Example 2.

[2. Configuration of Communication Module]

Figure 14:
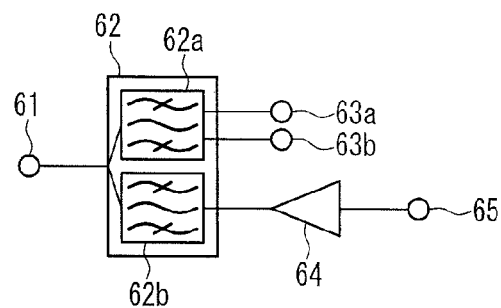
FIG. 14 is a block diagram of an example of a communication module.

FIG. 14 shows an example of a communication module including the piezoelectric thin-film resonator of this embodiment. As shown in FIG. 14, a duplexer 62 includes a receiving filter 62a and a transmitting filter 62b. The receiving filter 62a is connected to, e.g., receiving terminals 63a, 63b provided for balanced output. The transmitting filter 62b is connected to a transmitting terminal 65 via a power amplifier 64. The receiving filter 62a and the transmitting filter 62b include the piezoelectric thin-film resonators of this embodiment.

For a receiving operation, when reception signals are input via an antenna terminal 61, the receiving filter 62a transmits only the signals in a predetermined frequency band and outputs the signals from the receiving terminals 63a, 63b to the outside. For a transmitting operation, when transmission signals are input from the transmitting terminal 65 and then amplified by the power amplifier 64, the transmitting filter 62b transmits only the signals in a predetermined frequency band and outputs the signals from the antenna terminal 61 to the outside.

In this embodiment, a communication module capable of reducing spurious can be provided at a low cost.

The configuration of the communication module shown in FIG. 14 is an example, and a similar effect also can be obtained by incorporating the piezoelectric thin-film resonator of this embodiment into the communication modules having other configurations.

[3. Configuration of Communication Device]

Figure 15:
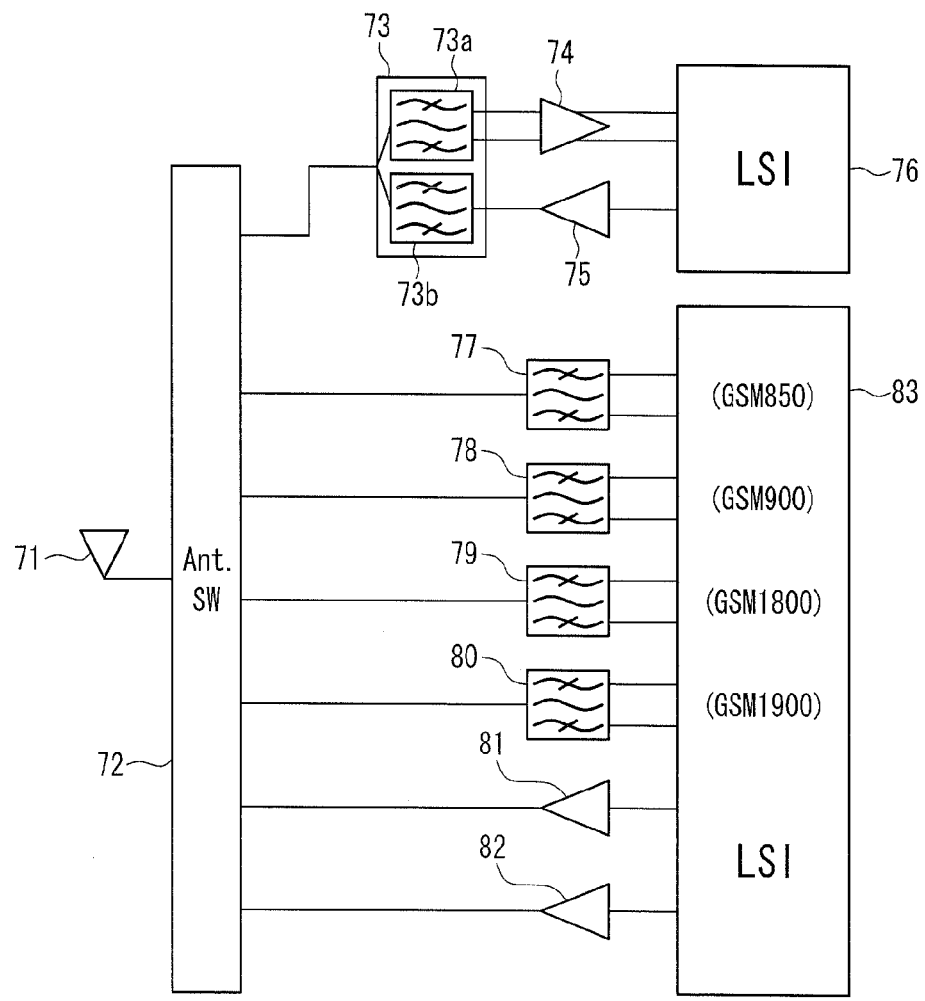
FIG. 15 is a block diagram of an example of a communication device.

FIG. 15 shows an RF block of a mobile phone terminal as an example of a communication device including the piezoelectric thin-film resonator of this embodiment or the communication module as described above. The communication device shown in FIG. 15 indicates the configuration of a mobile phone terminal that is compatible with the GSM (global system for mobile communications) system and the W-CDMA (wideband code division multiple access) system, for example. The GSM system in this embodiment uses a 850 MHz band, a 950 MHz band, 1.8 GHz band, and 1.9 GHz band. Although the mobile phone terminal includes a microphone, a speaker, a liquid crystal display, etc. other than the configuration shown in FIG. 15, those components are not necessary in the description of this embodiment, and therefore are omitted from FIG. 15. In this case, receiving filters 73a and 77 to 80 and a transmitting filter 73b include the piezoelectric thin-film resonators of this embodiment.

First, reception signals are input to an antenna switching circuit 72 via an antenna 71. The antenna switching circuit 72 selects an LSI to be used for an operation depending on whether the communication system of the reception signals is the W-CDMA system or the GSM system. If the input reception signals conform to the W-CDMA system, switching is performed so that the reception signals are output to a duplexer 73. The reception signals input to the duplexer 73 are limited to a predetermined frequency band by the receiving filter 73a, and then the balanced reception signals are output to an LNA 74. The LNA 74 amplifies the input reception signals and outputs them to an LSI 76. The LSI 76 performs demodulation based on the input reception signals to produce sound signals, and controls the operation of each unit in the mobile phone terminal.

On the other hand, in the case of signal transmission, the LSI 76 generates transmission signals. The generated transmission signals are amplified by a power amplifier 75 and then input to the transmitting filter 73b. The transmitting filter 73b transmits only the signals of the received transmission signals that are within a predetermined frequency band. The transmission signals from the transmitting filter 73b are output to the outside from the antenna 71 via the antenna switching circuit 72.

If the input reception signals conform to the GSM system, the antenna switching circuit 72 selects any one of the receiving filters 77 to 80 in accordance with the frequency band, and outputs the reception signals to the selected receiving filter. After the frequency band of the reception signals has been limited by one of the receiving filters 77 to 80, the reception signals are input to an LSI 83. The LSI 83 performs demodulation based on the input reception signals to produce sound signals, and controls the operation of each unit in the mobile phone terminal. On the other hand, in the case of signal transmission, the LSI 83 generates transmission signals. The generated transmission signals are amplified by a power amplifier 81 or 82 and then output to the outside from the antenna 71 via the antenna switching circuit 72.

In this embodiment, a communication device capable of reducing spurious can be provided at a low cost.

[4. Effects of this Embodiment and Others]

In this embodiment, the island patterns 51a of the mass load film 51 are densely arranged as they get closer to the central portion of the region where the upper electrode 45 and the lower electrode 43 face each other (i.e., the opposing region), and the island patterns 51a are sparsely arranged as they get closer to the peripheral portion of the opposing region. With this configuration, a piezoelectric thin-film resonator that reduces unwanted spurious and has excellent characteristics can be provided at a low cost. Arranging the island patterns 51a of the mass load film 51 densely in the central portion and sparsely in the peripheral portion of the opposing region is equal to the fact that the pseudo-density of the film is made high in the central portion and low in the peripheral portion. Thus, this arrangement can reduce the confinement effect of a transverse acoustic wave that is other than the thickness longitudinal vibration (principal vibration) and causes unwanted spurious, which results in a reduction in unwanted spurious.

Figure 16:
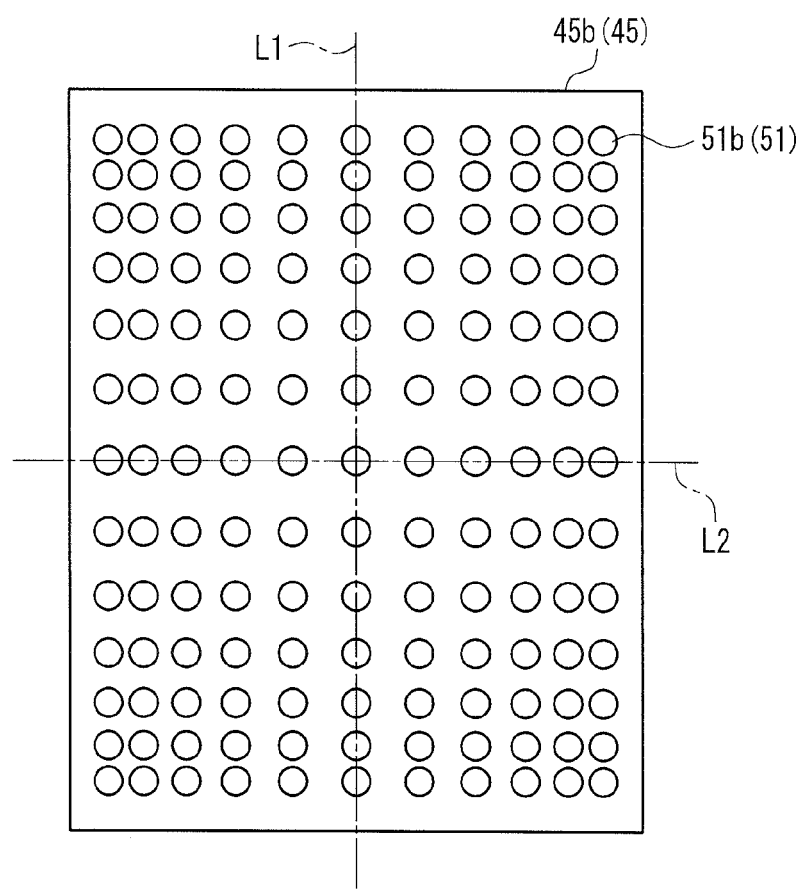
FIG. 16 is a plan view showing a modified example of a mass load film.

In Example 1, the mass load film 51 includes the island patterns 51a, as shown in FIG. 4. However, the mass load film 51 may include hole patterns. FIG. 16 is a plan view of the mass load film 51 including hole patterns 51b. As shown in FIG. 16, the hole patterns 51b of the mass load film 51 are sparsely arranged as they get closer to the central portion (containing a point of intersection of two lines L1 and L2) of the opposing region, and the hole patterns 51b are densely arranged as they get closer to the peripheral portion of the opposing region. A piezoelectric thin-film resonator including the mass load film 51 with the above configuration can have the same resonance characteristics as those shown in FIG. 5, and also can reduce unwanted spurious.

The following notes are disclosed with respect to this embodiment.

(Note 1)

A piezoelectric thin-film resonator includes a substrate, a lower electrode provided on the substrate, a piezoelectric film provided on the lower electrode, and an upper electrode that is located opposite the lower electrode across at least a part of the piezoelectric film. The upper electrode includes a plurality of concave or convex patterns in at least a region that faces the lower electrode. The plurality of concave or convex patterns are densely arranged in a central portion of the region and are sparsely arranged in a peripheral portion of the region.

If the region where the upper electrode and the lower electrode face each other (i.e., the opposing region) is in the form of a square, a transverse mode acoustic wave that propagates from a certain point on any side of this region is reflected from the opposite parallel side at right angles and returns to the original point. When a plurality of acoustic waves travel back and fourth along the same resonance path as described above, unwanted spurious occurs. In this case, however, the upper electrode includes the plurality of concave or convex patterns in the opposing region so that the pitch is varied at a constant rate. Therefore, the transverse mode acoustic wave that propagates from a certain point is reflected from the boundary between the concave or convex patterns. Moreover, since the concave or convex patterns are densely arranged in the central portion and sparsely arranged in the peripheral portion of the opposing region, the same resonance path is hardly formed. Accordingly, the occurrence of a transverse mode standing wave can be suppressed, and thus spurious can be reduced.

(Note 2)

A piezoelectric thin-film resonator includes a substrate, a lower electrode provided on the substrate, a piezoelectric film provided on the lower electrode, and an upper electrode that is located opposite the lower electrode across at least a part of the piezoelectric film. A mass load film is provided on the upper electrode. The mass load film includes a plurality of concave or convex patterns in at least a region that faces the lower electrode. The plurality of concave or convex patterns are densely arranged in a central portion of the region and are sparsely arranged in a peripheral portion of the region. With this configuration, a piezoelectric thin-film resonator that reduces spurious can be provided.

(Note 3)

The piezoelectric thin-film resonator according to note 1 or 2, wherein a pitch of the concave or convex patterns is regularly varied so that the concave or convex patterns are densely arranged in the central portion of the region and are sparsely arranged in the peripheral portion of the region. This configuration can reduce the transverse mode spurious in a manner with excellent design performance.

(Note 4)

The piezoelectric thin-film resonator according to any one of notes 1 to 3, wherein the concave or convex patterns are formed in a portion of the upper electrode. This configuration can suppress an increase in electrode resistance, so that a piezoelectric thin-film resonator that has low loss and reduces spurious can be provided.

(Note 5)

The piezoelectric thin-film resonator according to any one of notes 1 to 4, wherein the concave or convex patterns are island-like or hole-like dot patterns. With this configuration, a piezoelectric thin-film resonator that reduces spurious can be provided.

(Note 6)

The piezoelectric thin-film resonator according to any one of notes 1 to 5, wherein a mass load film is formed on the concave or convex patterns of the upper electrode. With this configuration, a piezoelectric thin-film resonator that reduces spurious can be provided.

(Note 7)

The piezoelectric thin-film resonator according to note 2, wherein a height of the shape of the mass load film is comparable to a thickness of the mass load film. With this configuration, the height of the patterns can be properly controlled, so that a piezoelectric thin-film resonator that reduces spurious can be stably provided.

(Note 8)

The piezoelectric thin-film resonator according to note 2, wherein a material of the mass load film differs from a material of the upper electrode. With this configuration, the height of the patterns can be properly controlled, so that a piezoelectric thin-film resonator that reduces spurious can be stably provided.

(Note 9)

The piezoelectric thin-film resonator according to note 2, wherein a combination of a material of the mass load film and a material of the upper electrode is a combination of materials with etching selectivity. With this configuration, the height of the patterns can be properly controlled, so that a piezoelectric thin-film resonator that reduces spurious can be stably provided.

(Note 10)

The piezoelectric thin-film resonator according to note 2, wherein another mass load film is provided between the mass load film and the upper electrode. With this configuration, a piezoelectric thin-film resonator that reduces spurious can be provided.

(Note 11)

The piezoelectric thin-film resonator according to note 2, wherein another mass load film is provided on the mass load film. With this configuration, a piezoelectric thin-film resonator that reduces spurious can be provided.

(Note 12)

The piezoelectric thin-film resonator according to note 1 or 2, wherein an overlapping region of the upper electrode and the lower electrode is in the form of an ellipse. This configuration can prevent the acoustic wave reflected from the outer edge of the piezoelectric thin film from being a transverse standing wave in a resonator, so that a piezoelectric thin-film resonator that reduces spurious further can be provided.

(Note 13)

The piezoelectric thin-film resonator according to note 1 or 2, wherein an overlapping region of the upper electrode and the lower electrode is in the form of a polygon with non-parallel sides. This configuration can prevent the acoustic wave reflected from the outer edge of the piezoelectric thin film from being a transverse standing wave in a resonator, so that a piezoelectric thin-film resonator that reduces spurious further can be provided.

(Note 14)

An acoustic wave device includes at least one piezoelectric thin-film resonator according to any one of notes 1 to 13. This configuration can provide a small high-performance acoustic wave device.

(Note 15)

A filter device includes at least one piezoelectric thin-film resonator according to any one of notes 1 to 13. This configuration can provide a small high-performance filter device.

(Note 16)

A duplexer includes at least one piezoelectric thin-film resonator according to any one of notes 1 to 13. This configuration can provide a small high-performance duplexer.

(Note 17)

A communication module includes at least one piezoelectric thin-film resonator according to any one of notes 1 to 13. This configuration can provide a small high-performance communication module.

(Note 18)

A communication device includes at least one piezoelectric thin-film resonator according to any one of notes 1 to 13. This configuration can provide a small high-performance communication device.

The present application is useful for a piezoelectric thin-film resonator, a communication module, and a communication device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A piezoelectric thin-film resonator comprising:
a substrate;
a lower electrode provided on the substrate;
a piezoelectric film provided on the lower electrode; and
an upper electrode that is located opposite the lower electrode across at least a part of the piezoelectric film,
wherein a mass load film is provided on the upper electrode,
the mass load film includes a plurality of concave or convex patterns in at least a region that faces the lower electrode, and
the plurality of concave or convex patterns are densely arranged in a central portion of the region and are sparsely arranged in a peripheral portion of the region,
wherein the upper electrode has a plurality of concave or convex patterns that are to be fitted into the concave or convex patterns.

2. The piezoelectric thin-film resonator according to claim 1, wherein a pitch of the concave or convex patterns is regularly varied so that the concave or convex patterns are densely arranged in the central portion of the region and are sparsely arranged in the peripheral portion of the region.

3. The piezoelectric thin-film resonator according to claim 1, wherein the concave or convex patterns are island-like or hole-like dot patterns.

4. A communication module comprising the piezoelectric thin-film resonator according to claim 1.

* * * * *